United States Patent
Liu et al.

(10) Patent No.: US 6,911,399 B2
(45) Date of Patent: Jun. 28, 2005

(54) METHOD OF CONTROLLING CRITICAL DIMENSION MICROLOADING OF PHOTORESIST TRIMMING PROCESS BY SELECTIVE SIDEWALL POLYMER DEPOSITION

(75) Inventors: Wei Liu, San Jose, CA (US); David Mui, Fremont, CA (US)

(73) Assignee: Applied Materials, Inc., Santa Clara, CA (US)

(*) Notice: Subject to any disclaimer, the term of this patent is extended or adjusted under 35 U.S.C. 154(b) by 0 days.

(21) Appl. No.: 10/665,934

(22) Filed: Sep. 19, 2003

(65) Prior Publication Data

US 2005/0064719 A1 Mar. 24, 2005

(51) Int. Cl.$^7$ .............................................. H01L 21/302
(52) U.S. Cl. ............................................................ 438/725
(58) Field of Search ............................... 438/689, 708, 438/710, 712, 714, 717, 751, 694, 706, 707, 711, 725; 716/19, 21; 430/269, 299

(56) References Cited

U.S. PATENT DOCUMENTS

| | | |
|---|---|---|
| 4,447,731 A | 5/1984 | Kuni et al. |
| 4,767,496 A | 8/1988 | Hieber |
| 4,911,103 A | 3/1990 | Davis et al. |
| 5,109,430 A | 4/1992 | Nishihara et al. |
| 5,171,393 A | 12/1992 | Moffat |
| 5,452,521 A | 9/1995 | Niewmierzycki |
| 5,653,894 A | 8/1997 | Ibbotsen et al. |
| 5,798,529 A | 8/1998 | Wagner |
| 5,913,102 A | 6/1999 | Yang |
| 5,926,690 A | 7/1999 | Toprac et al. ............... 438/17 |
| 5,944,940 A | 8/1999 | Toshima |
| 5,948,203 A | 9/1999 | Wang |
| 5,963,329 A | 10/1999 | Conrad et al. |
| 5,980,766 A | 11/1999 | Flamm et al. |
| 6,001,699 A | 12/1999 | Nguyen et al. |
| 6,004,706 A | 12/1999 | Ausschnitt et al. |
| 6,007,675 A | 12/1999 | Toshima |
| 6,027,842 A | 2/2000 | Ausschnitt et al. |
| 6,033,814 A | 3/2000 | Burdorf et al. |
| 6,054,710 A | 4/2000 | Bruggeman |

(Continued)

FOREIGN PATENT DOCUMENTS

| | | |
|---|---|---|
| EP | 0 727 715 | 8/1996 |
| EP | 1 079 428 | 2/2001 |
| EP | 1 083 424 | 3/2001 |
| JP | 61 290312 | 12/1986 |
| WO | WO 01/09934 A1 | 2/2001 |
| WO | WO 01/84382 A1 | 11/2001 |
| WO | WO 02/09170 A2 | 1/2002 |
| WO | WO 02/37186 A1 | 5/2002 |
| WO | WO 03/003447 A2 | 1/2003 |

OTHER PUBLICATIONS

Yang, et al., "Line–Profile and Critical Dimension Measurements Using a Normal Incidence Optical Metrology System," Proceedings of SPIE vol. 4689, Mar. 2002.

(Continued)

*Primary Examiner*—George Fourson
*Assistant Examiner*—Brook Kebede
(74) *Attorney, Agent, or Firm*—Moser, Patterson & Sheridan, LLP.; Joseph Bach

(57) ABSTRACT

A method for trimming photoresist features on a semiconductor substrate in a processing system. The method utilizes a process gas mixture comprising a hydrocarbon gas, an oxygen gas and an inert gas. The critical dimension (CD) microloading of the dense and the isolated regions can be eliminated and the photoresist trimming rate can also be reduced to enable better critical dimension (CD) control.

17 Claims, 4 Drawing Sheets

U.S. PATENT DOCUMENTS

| | | | |
|---|---|---|---|
| 6,124,212 | A | 9/2000 | Fan et al. |
| 6,143,081 | A | 11/2000 | Shinriki et al. |
| 6,148,239 | A | 11/2000 | Funk et al. |
| 6,161,054 | A | 12/2000 | Rosenthal et al. |
| 6,175,417 | B1 | 1/2001 | Do et al. |
| 6,178,239 | B1 | 1/2001 | Kishinsky et al. |
| 6,225,639 | B1 | 5/2001 | Adams et al. |
| 6,245,581 | B1 | 6/2001 | Bonser et al. |
| 6,368,975 | B1 | 4/2002 | Balasubramhanya et al. |
| 6,388,253 | B1 | 5/2002 | Su ............................. 250/310 |
| 6,413,867 | B1 | 7/2002 | Sarfaty et al. |
| 6,424,417 | B1 | 7/2002 | Cohen et al. ............... 356/388 |
| 6,454,417 | B1 | 9/2002 | Takamoto et al. |
| 6,455,437 | B1 | 9/2002 | Davidow et al. |
| 6,479,309 | B1 | 11/2002 | Wright |
| 6,486,492 | B1 | 11/2002 | Su ............................. 257/48 |
| 6,501,555 | B1 | 12/2002 | Ghandchari et al. |
| 6,606,738 | B1 * | 8/2003 | Bell et al. ..................... 716/21 |
| 6,625,497 | B2 | 9/2003 | Fairbairn et al. |
| 6,762,130 | B2 * | 7/2004 | Laaksonen et al. ......... 438/706 |
| 2002/0072003 | A1 | 6/2002 | Brill et al. |
| 2002/0155629 | A1 | 10/2002 | Fairbairn et al. |
| 2002/0160628 | A1 * | 10/2002 | Okoroanyanwu et al. ... 438/795 |
| 2002/0171828 | A1 | 11/2002 | Cohen et al. |
| 2003/0000922 | A1 | 1/2003 | Subramanian et al. |
| 2003/0045098 | A1 | 3/2003 | Verhaverbeke et al. |
| 2003/0092281 | A1 * | 5/2003 | Ramachandramurthy et al. ......................... 438/725 |

OTHER PUBLICATIONS

Kota, et al., "Advanced Process Control for Polysilicon Gate Etching Using Integrated Optical CD Metrology", Proceedings of SPIE, vol. 5044 (2003) pp. 90–96.

Anthony J. Toprac, "AMD's Advanced Process Control of Poly–gate Critical Dimension", SPIE Conference on Process, Equipment and Materials Control in Integrated Circuit Manufacturing, Sep. 1999, Santa Clara, CA. SPIE, vol. 3882.

Lee, M.E., "Analysis of Reflectometry and Ellipsometry Data from Patterned Structures", Characterization and Metrology for ULSI Technology: 1998 International Conference, ed. D.G. Seiler, et al., 1998, pp. 331–335.

McIntosh, J.M., et al., "Approach to CD SEM Metrology Utilizing the Full Waveform Signal", Proceedings of the SPIE, vol. 3332, pp. 51–60, Feb. 23, 1998.

Ausschnit, Christopher P., et al., "Seeing the Forest for the Trees: A New Approach to CD Control," Ed. Bhanwar Singh, Proceeding of the SPIE, vol. 3332, pp. 212–220, Feb. 23–25, 1998.

Moharam, M.G., et al., "Stable Implementation of the Rigorous Coupled–Wave Analysis for Surface–Relief Gratings: Enhanced Transmittance Matrix Approach," Journal of the Optical Society of America, vol. 12, No. 5, pp. 1077–1086, May 1995.

Chateau, Nicolas, "Algorithm for the Rigorous Coupled–Wave Analysis of Grating Diffusion," Journal of the Optical Society of America, vol. 11, No. 4, pp 1321–1331, Apr. 1994.

G.P. Kotta, et al., "Integrated CD Metrolog for Poly Si Etching", Lam Research Corporation, Plasma Etch Users Group Meeting, Jan. 17, 2002.

Raymond, Christopher J., "Angle–Resolved Scatterometry of Semiconductor Manufacturing", Microlithography World, Winter 2000, pp. 18–23.

\* cited by examiner

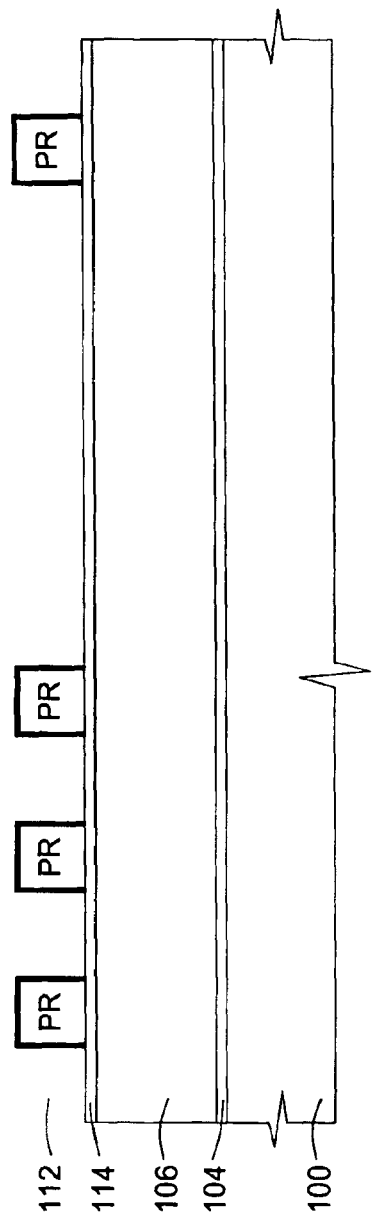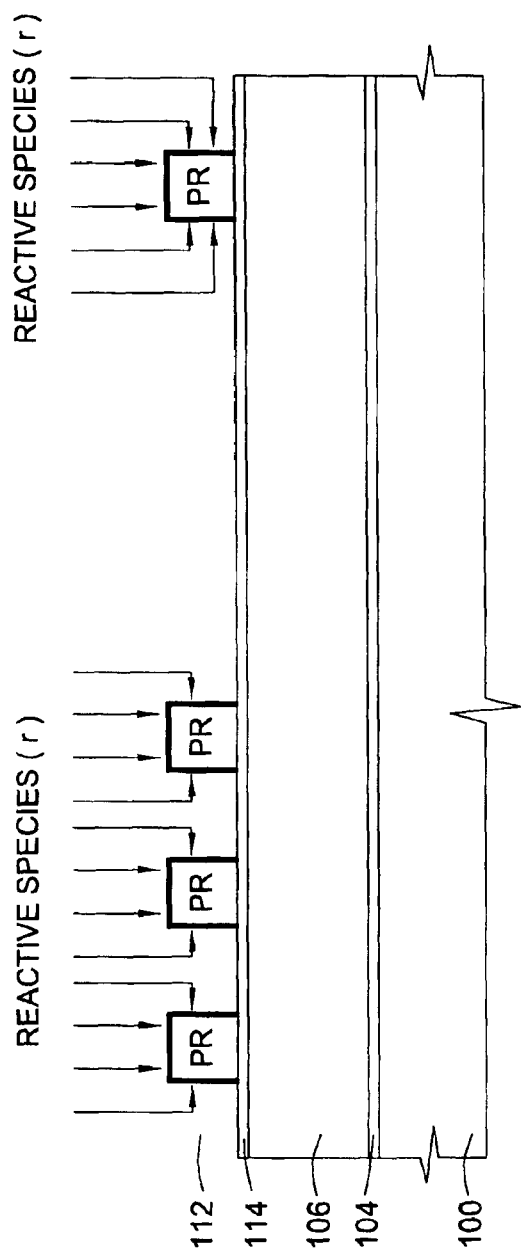
FIG. 2
FIG. 3

US 6,911,399 B2

METHOD OF CONTROLLING CRITICAL DIMENSION MICROLOADING OF PHOTORESIST TRIMMING PROCESS BY SELECTIVE SIDEWALL POLYMER DEPOSITION

BACKGROUND OF THE INVENTION

1. Field of the Invention

The present invention generally relates to a process of trimming a photoresist mask on a semiconductor substrate.

2. Description of the Related Art

To increase operational speed of devices (e.g., transistors, capacitors, and the like) in integrated microelectronic circuits, the device features have become ever smaller. The minimal dimensions of features of such devices are commonly called in the art, critical dimensions, or CDs. The CDs generally include the minimal widths of the features, such as lines, columns, openings, spaces between the lines, and the like.

One method of fabricating such features comprises forming a patterned mask (e.g., photoresist mask) on the material layer beneath such a mask (i.e., underlying layer) and then etching the material layer using the patterned mask as an etch mask.

The patterned masks are conventionally fabricated using a lithographic process when a pattern of the feature to be formed is optically transferred into a layer of photoresist. Then, the photoresist is developed and unexposed portions of the photoresist are removed, while the remaining photoresist forms a patterned mask.

An etch mask generally is, in a plan view, a replica of the feature to be formed (i.e., etched) in the underlying layer. As such, the etch mask comprises elements having same critical dimensions as the feature to be formed. Optical limitations of the lithographic process may not allow transferring a dimensionally accurate image of a feature into the photoresist layer when a CD of the element is smaller than optical resolution of the lithographic process.

To overcome limitations of the lithographic process, the photoresist mask may be fabricated using a two-step process. During a first step, the lithographic process is used to form the mask having elements with dimensions that are proportionally greater (i.e., "scaled up") than the dimensions of the features to be formed. During a second step, such "scaled-up" elements are trimmed (i.e., isotropically etched) to the pre-determined dimensions. The trimmed photoresist mask is then used as an etch mask during etching the underlying material layer or layers.

One problem in trimming such a photoresist mask is the occurrence of critical dimension (CD) microloading, which is a measure of variation in critical dimensions between dense and isolated regions of the substrate after photoresist trimming. The dense regions have a high pattern density of the features and the isolated regions have a low pattern density of the features. Conventional photoresist trimming processes often result in significant CD trimming microloading with the isolated regions being trimmed at much faster rates than dense regions.

Therefore, there is a need in the art for an improved method for controlling photoresist trimming process to reduce microloading effect during fabrication of semiconductor devices in a semiconductor substrate processing system.

SUMMARY OF THE INVENTION

The present invention is a method of trimming a photoresist mask on a substrate in a semiconductor substrate processing system. The method comprises the steps of placing a substrate with the photoresist mask in a chamber and trimming the photoresist using a plasma formed by process gases comprising a hydrocarbon gas, an oxygen gas ($O_2$) and an inert gas. In one embodiment, the hydrocarbon gas is halogenated.

One embodiment of the invention provides a plasma etch process for trimming photoresist features on a semiconductor substrate to achieve reduced microloading and reduced trim rate. The method comprises placing a substrate with a patterned photoresist layer having at least one element with a first prescribed width on the substrate in the processing system, supplying to the process chamber a process gas mixture comprising a halogenated hydrocarbon gas, an oxygen gas, and an inert gas, energizing the process to leave the patterned photoresist layer, and terminating the etch process to leave the patterned photoresist layer with at least one element with a second prescribed width on the substrate.

BRIEF DESCRIPTION OF THE DRAWINGS

The teachings of the present invention can be readily understood by considering the following detailed description in conjunction with the accompanying drawings, in which:

FIG. 2 is a diagram illustrating a cross-sectional view of a portion of a composite structure having a dense region and an isolated region.

FIG. 3 is a diagram illustrating a cross-sectional view of a portion of a composite structure having a dense region and an isolated region with reactive (etching and passivating) species near both regions.

To facilitate understanding, identical reference numerals have been used, where possible, to designate identical elements that are common to the figures.

It is to be noted, however, that the appended drawings illustrate only exemplary embodiments of this invention and are therefore not to be considered limiting of its scope, for the invention may admit to other equally effective embodiments.

DETAILED DESCRIPTION

Figure 1:
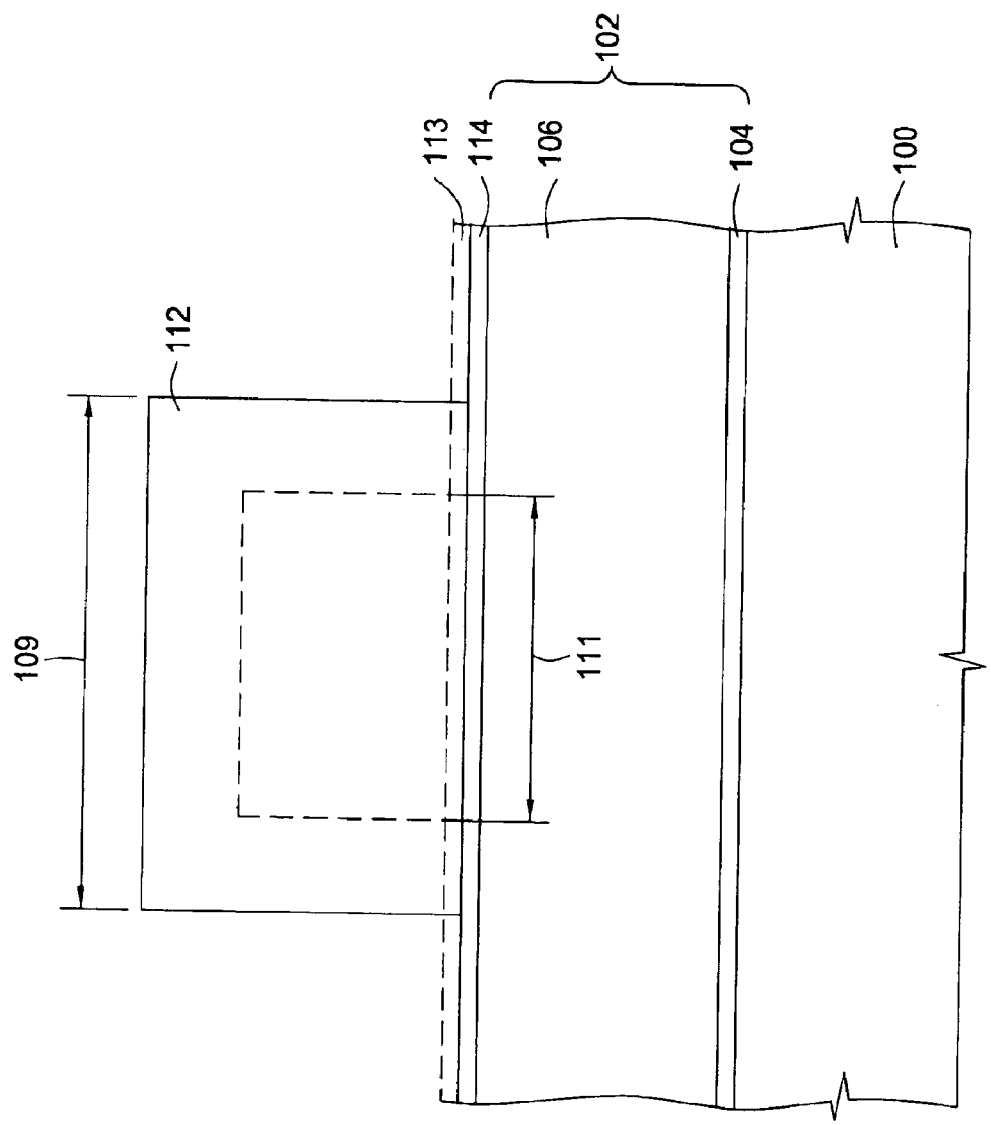
FIG. 1 is a diagram illustrating a cross-sectional view of a portion of a composite structure having a photoresist mask thereon prior to trimming.

FIG. 1 illustrates a cross-sectional view of a portion of a composite structure having a photoresist mask thereon prior to trimming. The composite structure comprises a substrate 100, upon which is a film stack 102, within which a structure, e.g., a gate, is to be formed thereon. The film stack 102 generally comprises a gate electrode layer 106 and a gate dielectric layer 104. The gate electrode is patterned by a photoresist mask 112 (e.g. photoresist patterned mask), an optional film of an anti-reflective coating (ARC) 113 (shown only in FIG. 1 with dashed lines), as well as a hard mask 114, underneath.

The hard mask 114 is generally used as an etch mask for etching both the gate electrode layer 106 and the gate dielectric layer 104 and may comprise, for example, silicon dioxide ($SiO_2$), silicon oxynitride (SiON), amorphous carbon (i.e., α-carbon), Advanced Patterning Film™ (APF)

(available from Applied Materials, Inc. of Santa Clara, Calif.), and the like.

In one exemplary embodiment, the gate electrode layer 106 is formed of doped polysilicon (Si) to a thickness of about 500 to 3000 Angstroms and the gate dielectric layer 104 is formed of a dielectric material such as silicon dioxide ($SiO_2$) to a thickness of about 10 to 60 Angstroms. Alternatively, the gate dielectric layer 104 may comprise silicon nitride, silicon oxynitride, or one or more high-K dielectric materials having a dielectric constant greater than 4.0, such as hafnium dioxide ($HfO_2$), hafnium silicon dioxide ($HfSiO_4$), hafnium silicon oxynitride ($HfSiO_xN_y$), barium strontium titanate ($BaSrTiO_3$, or BST), lead zirconate titanate ($Pb(ZrTi)O_3$, or PZT), and the like. It should be noted, however, that the film stack 102 may comprise layers formed of other materials, as well as layers having different thicknesses.

The layers that comprise the film stack 102 may be formed using any conventional deposition technique, such as, atomic layer deposition (ALD), physical vapor deposition (PVD), chemical vapor deposition (CVD), plasma enhanced CVD (PECVD), and the like. Fabrication of the CMOS field effect transistor may be performed using the respective processing modules of CENTURA®, ENDURA®, and other semiconductor wafer processing systems available from Applied Materials, Inc. of Santa Clara, Calif.

The patterned mask 112 is generally a photoresist mask having a width 109. The photoresist mask 112 is generally formed using a lithographic process. Due to optical limitations of the lithographic process, the photoresist mask may comprise a scaled-up replica of the structure to be etched in the underlying layer or layers. As such, after the lithographic process, such photoresist mask 112 may optionally be trimmed to width 111 that is smaller than the width 109 of the lithographically patterned mask 112 before the mask is used as an etch mask.

The trimming process is generally an isotropic etch process (e.g., isotropic plasma etch process) that is performed upon the photoresist mask 112 to reduce the width 109 thereof. There are two well-known trimming processes. One involves HBr, $O_2$ and Ar, while the other one involves $Cl_2$; $O_2$ and an inert dilute gas, such as Ar. Details of these processes are described in U.S. Pat. No. 6,121,155, U.S. Pat. No. 6,423,457, U.S. Pat. No. 6,514,871, and U.S. Pat. 6,174,818.

One common problem with these photoresist trimming processes is the occurrence of significant critical dimension (CD) microloading, which is a measure of the variation of critical dimensions between dense and isolated regions of the substrate after photoresist trimming. The CD microloading by the conventional photoresist trimming processes results from the isolated regions being trimmed at much faster rates than dense regions. This is likely caused by higher amount of etching species per photoresist surface area near the isolated region compared to the dense regions and also by lack of passivant species (such as polymer precursor and/or polymer) to be deposited on the feature (photoresist) surfaces to reduce the photoresist etch rate. FIG. 2 shows that the total photoresist (PR) surface area (shown by darkened lines) in the dense region is larger than the total PR surface area (shown by darkened lines) in the isolated region. Since the amounts of etching species, generated from gas reactants, in both regions are the same, the amount of etching species per photoresist surface area is lower in the dense region, compared to the isolated region, due to the difference in total PR surface area in these two regions.

The photoresist surfaces in the dense regions receive fewer etching species per surface area compared to the surfaces in the isolated regions due to larger total surface areas. The difference in reactant per surface area between these two regions increases as pattern density difference increases. Although HBr in one of the conventional photoresist trimming processes is supposed to cause polymer passivation (or redeposition) to achieve self-limiting photoresist trimming, the degree of polymer passivation is not sufficient to counter CD microloading effect. Due to the combination of large difference in etching reactant concentration between the dense and isolated region and insufficient passivation control, the percentage of CD microloading between the dense region and the isolated region could be as much as 40%. Conventionally, the percentage of CD microloading is defined by dividing the difference between the amount trimmed in the isolated region and the amount trimmed in the dense region to the averaged trimmed amount of these two regions and then multiplying the result by 100%.

The invention described a photoresist trimming process that involves a hydrocarbon gas that is non-halogenated ($C_xH_y$), such as $CH_4$, $C_2H_6$, and the like, and/or a halogenated hydrocarbon gas, such as $CHF_3$, $CH_2F_2$, $CH_3F$, $C_2H_2F_4$, $CHBr_3$, and the like. The halogenated hydrocarbon gas, such as $CHF_3$, is believed to be disassociated in the plasma to $CF_2$, $CF_3$ and CHF, which act as polymer precursors to form a polymer layer on the sidewall. The non-halogenated hydrocarbon gas, such as $CH_4$, is believed to be disassociated in the plasma to form CH, $CH_2$ and $CH_3$, which also act as polymer precursors to form a polymer on the sidewall of the photoresist mask. For convenience of describing the invention, $CHF_3$ will be used as an example hereon. In addition to the polymer precursor generating gas, the photoresist trimming process also involves oxygen ($O_2$) and an inert gas, such as, argon (Ar). The oxygen gas is used to provide etching species, while the inert gas is used to maintain plasma and to dilute the reactive gas mixture. The pressure of the trimming process is between 2 to 50 mTorr. The source power is between 200 to 1500 watts. The bias power is between 0 (optional) to 400 watts. The $CHF_3$ flow rate is between 20 to 400 sccm. The oxygen flow rate is between 5 to 100 sccm and the inert gas, such as argon, flow rate is between 20 to 400 sccm. The trimming process may be performed using a plasma etch reactor, e.g., a Decoupled Plasma Sources DPS® II module of the CENTURA® system.

The polymer precursors generated from $CHF_3$ are better at forming polymer passivant than HBr. FIG. 3 illustrates a cross-sectional view of a portion of a composite structure having a dense region and an isolated region with reactive species (r) which includes etching species, such as oxygen-containing radical, and polymer precursors, generated from $CHF_3$, near both regions. The relative amount of etching species and polymer precursors can be tuned by adjusting the gas flow rates and process conditions. The photoresist surfaces in the dense region receives fewer etching species and polymer precursor per surface area compared to the surface in the isolated region due to larger total surface area. The difference in etching species and polymer precursor per surface area between these two regions increases as pattern density difference increases. The etch reactant etches the photoresist, while the polymer precursor generates a polymer that protects photoresist from being etched. Since these two species have opposite effects on photoresist removal, the CD microloading effect due to pattern density difference can be eliminated. With $CHF_3$ to $O_2$ ratio adjustment, the microloading effect can even be reversed, which means that the post-trimmed CD of the dense region can be even larger than the isolated area.

One example is a photoresist trimming conducted under 4 mTorr, 500 watts source power, 0 bias power, 120 sccm $CHF_3$, 120 sccm Ar, and 25 sccm $O_2$ for 50 seconds. The results are shown in Table 1. The CD microloading is reduced from 21.5% with the conventional $HBr/O_2/Ar$ process to 3.6% by this new $CHF_3/O_2/Ar$ process. The $HBr/O_2/Ar$ process is conducted under 4 mTorr, 500 watts source power, 0 watt bias power, 80 sccm HBr, 25 sccm $O_2$ and 20 sccm Ar.

TABLE 1

Microloading results of using the proposed chemistry.

| Trim amount | Dense (nm) | Isolated (nm) | Microloading (nm) | Microloading (%) |
|---|---|---|---|---|
| $HBr/O_2/Ar$ process | 34.49 | 42.80 | 8.31 | 21.5 |
| $CHF_3/O_2/Ar$ process | 16.70 | 17.31 | 0.61 | 3.6 |

The proposed chemistry has another advantage of lower trimming rate. A typical $HBr/O_2/Ar$ trim process has a trim rate of about 1 to 2 nm/second. While using $CHF_3/O_2/Ar$ chemistry, the trim rate can be as low as 0.3 nm/second and post-trim photoresist profile is good. Low trim rate allows more accurate process time and better CD control.

The inventive process can be applied to all photoresist used in wafer patterning. An example is a DUV resist, Apex-E®, made by Shipley, located in Marlborough, Mass.

The DPS® II module (discussed with reference to FIG. 4 below) uses a power source (i.e., an inductively coupled antenna) to produce a high density inductively coupled plasma. To determine the endpoint of the etch process, the DPS® II module may also include an endpoint detection system that monitors plasma emissions at a particular wavelength, controls the process time, or performs laser interferometery, and the like.

Figure 4:
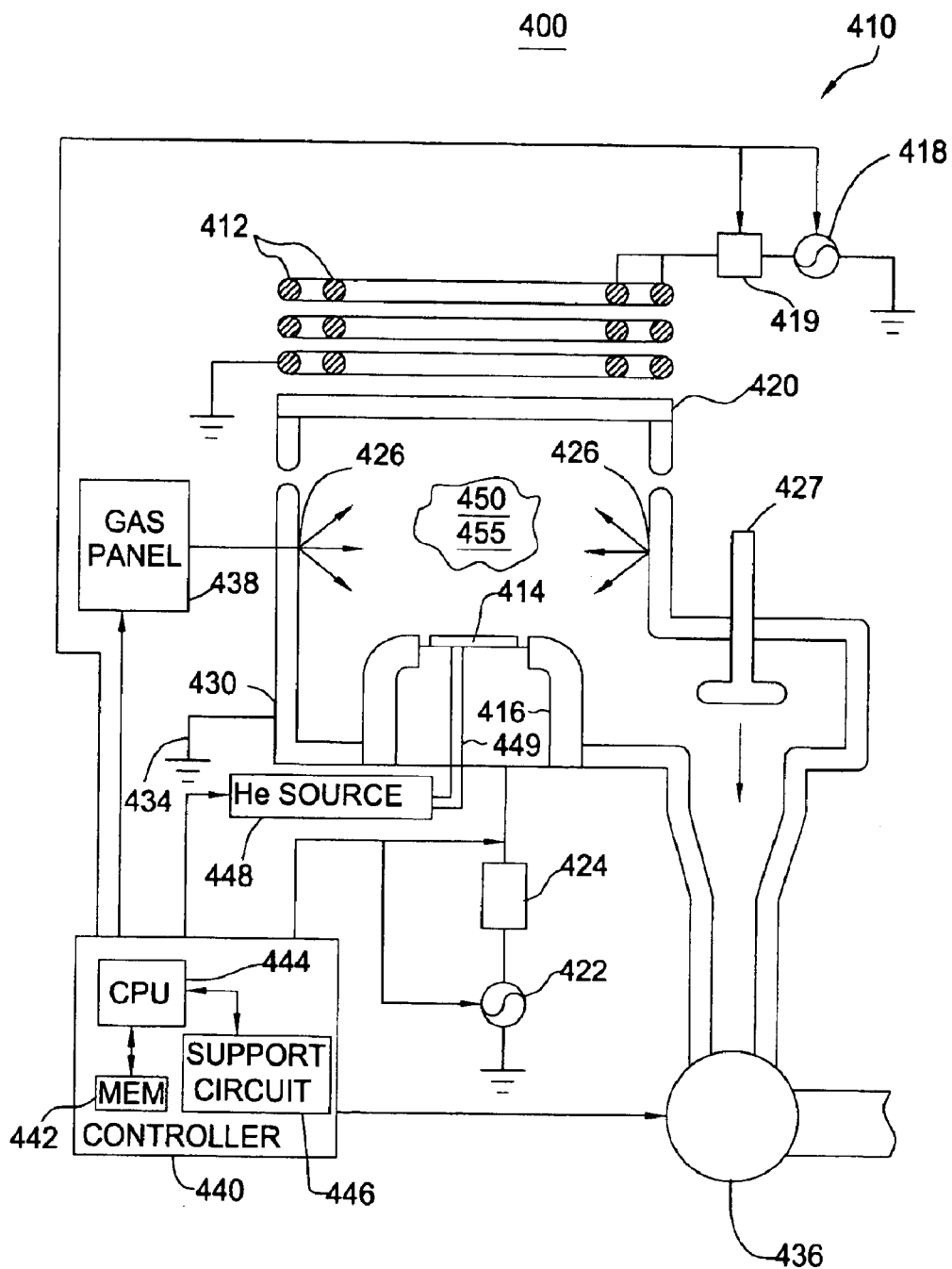
FIG. 4 depicts a schematic diagram of an exemplary integrated semiconductor substrate processing system of the kind used in performing portions of the inventive method.

FIG. 4 depicts a schematic diagram of the exemplary Decoupled Plasma Source DPS® II etch reactor 400 that may be used to practice portions of the invention. The DPS® II reactor is generally used as a processing module of the CENTURA® processing system available from Applied Materials, Inc. of Santa Clara, Calif.

The reactor 400 comprises a process chamber 410 having a wafer support pedestal 416 within a conductive body (wall) 430, and a controller 440. The chamber 410 is supplied with a substantially flat dielectric ceiling 420. Other modifications of the chamber 410 may have other types of ceilings, e.g., a dome-shaped ceiling. Above the ceiling 420 is disposed an antenna comprising at least one inductive coil element 412 (two co-axial elements 412 are shown). The inductive coil element 412 is coupled, through a first matching network 419, to a plasma power source 418. The plasma source 418 typically is capable of producing up to 3000 W at a tunable frequency in a range from 50 kHz to 13.56 MHz.

The support pedestal (cathode) 416 is coupled, through a second matching network 424, to a biasing power source 422. The biasing power source 422 generally is capable of producing up to 10 kW at a frequency of approximately 13.56 MHz. The biasing power may be either continuous or pulsed power. In other embodiments, the biasing power source 422 may be a DC or pulsed DC source.

A controller 440 comprises a central processing unit (CPU) 444, a memory 442, and support circuits 446 for the CPU 444 and facilitates control of the components of the chamber 410 and, as such, of the etch process, as discussed.

In operation, a semiconductor wafer 414 is placed on the pedestal 416 and process gases are supplied from a gas panel 438 through entry ports 426 to form a gaseous mixture 450. The gaseous mixture 450 is ignited into a plasma 455 in the chamber 410 by applying power from the plasma source 418 and biasing source power 422 to the inductive coil element 412 and the cathode 416, respectively. The pressure within the interior of the chamber 410 is controlled using a throttle valve 427 and a vacuum pump 436. Typically, the chamber wall 430 is coupled to an electrical ground 434. The temperature of the wall 430 is controlled using liquid-containing conduits (not shown) that run through the wall 430.

The temperature of the wafer 414 is controlled by stabilizing a temperature of the support pedestal 416. In one embodiment, helium gas from a gas source 448 is provided via a gas conduit 449 to channels (not shown) formed in the pedestal surface under the wafer 414. The helium gas is used to facilitate heat transfer between the pedestal 416 and the wafer 414. During processing, the pedestal 416 may be heated by a resistive heater (not shown) within the pedestal to a steady state temperature and then the helium gas facilitates uniform heating of the wafer 414. Using such thermal control, the wafer 414 is maintained at a temperature between about 20 to 350 degrees Celsius.

Those skilled in the art will understand that other etch chambers may be used to practice the invention, including chambers with remote plasma sources, electron cyclotron resonance (ECR) plasma chambers, and the like.

To facilitate control of the process chamber 410 as described above, the controller 440 may be one of any form of general-purpose computer processor that can be used in an industrial setting for controlling various chambers and sub-processors. The memory 442, or computer-readable medium, of the CPU 444 may be one or more of readily available memory such as random access memory (RAM), read only memory (ROM), floppy disk, hard disk, or any other form of digital storage, local or remote. The support circuits 346 are coupled to the CPU 444 for supporting the processor in a conventional manner. These circuits include cache, power supplies, clock circuits, input/output circuitry and subsystems, and the like. The inventive method is generally stored in the memory 442 as a software routine. The software routine may also be stored and/or executed by a second CPU (not shown) that is remotely located from the hardware being controlled by the CPU 444.

Figure 5:
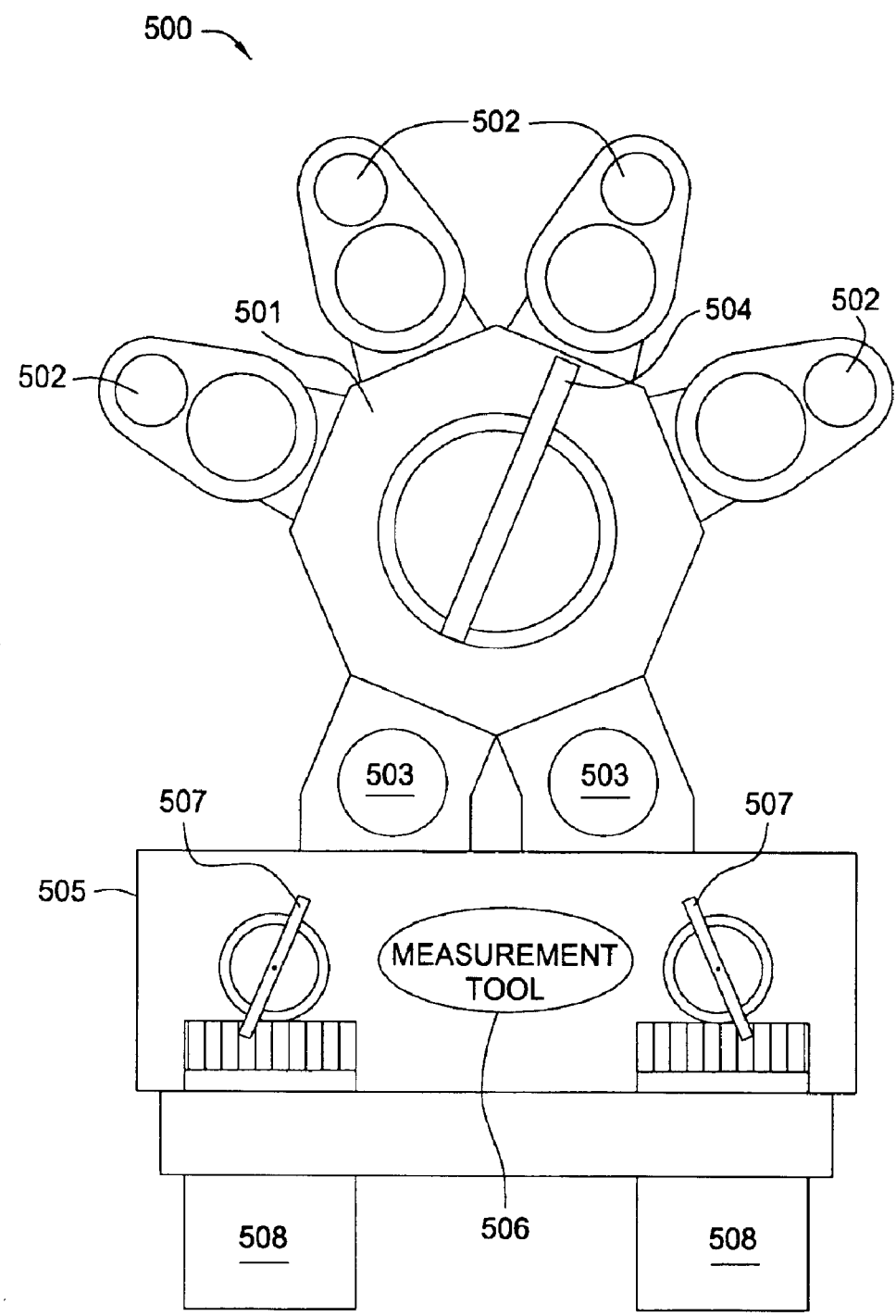
FIG. 5 is a diagram of one embodiment of an integrate etch system.

An example of an etch system that is integrated with an ex-situ metrology tool with the capability of measuring CDs and film thickness is Applied Materials' Transforma system 500 (FIG. 5). Detailed information describing Applied Materials' Transforma system has been disclosed in a commonly assigned U.S. patent application Ser. No. 10/428,145, titled "Method and Apparatus for Controlling Etch Processes During Fabrication of Semiconductor Devices", filed on May 1, 2003. The system comprises a chamber or "mainframe" 501, such as the Centura™ processing system for mounting a plurality of processing chambers, e.g., conventional etch reactors 502, such as DPSII™ silicon etch chambers and one or more transfer chambers 503, also called "load locks". In one embodiment of the present invention, four etch reactors 502 are mounted to the mainframe 501. In one exemplary embodiment, three etchers 502 are used for etching and one is optionally used for post-etch cleaning (i.e. removing photoresist polymers and other residue from wafers after etching). A robot 504 is provided within the mainframe 501 for transferring wafers between the processing reactors 502 and the transfer chambers 503. The transfer chambers 503 are connected to a factory interface 505, also known as a "mini environment", which maintains a controlled environment. A metrology (or measurement) tool 506 could be integrated in the load lock area 505 and with high-speed data collection and analysis capabilities, every wafer that enters the system 500 can be measured for thickness before and after etch processing. The metrology tool 506 could also be placed at different location within the process system 500. One or more of the process chambers 502 could also be deposition chambers, since the concept of the invention also applies to deposition process.

The invention may be practiced for trimming photoresist used as etch mask for other types of features, such as metal lines. The invention may also be practiced using other semiconductor wafer processing systems wherein the processing parameters may be adjusted to achieve acceptable characteristics by those skilled in the arts by utilizing the teachings disclosed herein without departing from the spirit of the invention. Although the forgoing discussion referred to trimming the patterned masks used during etch processes, other processes used for fabricating the integrated circuits can benefit from the invention.

What is claimed is:

1. A method for trimming photoresist features on a semiconductor substrate in a plasma processing system, comprising: placing a substrate with a patterned photoresist layer having at least one element with a first prescribed width on the substrate in the plasma processing system; supplying to the process chamber a process gas mixture comprising a hydrocarbon gas, an oxygen gas, and an inert gas, or a process gas mixture comprising a halogenated hydrocarbon gas, an oxygen gas, and an inert gas, or a mixture thereof and disassociating the process gas mixture to etch the patterned photoresist layer.

2. The method of claim 1 further comprising:
terminating the etch process to leave the patterned photoresist layer with at least one element with a second prescribed width on the substrate.

3. The method of claim 1 wherein the halogenated hydrocarbon gas is $CHF_3$.

4. The method of claim 3 wherein the hydrocarbon gas is $CH_4$.

5. The method of claim 1 wherein the flow rate of the hydrocarbon gas is between about 20 sccm to about 400 sccm and the flow rate ratio of hydrocarbon gas to oxygen gas is between about 1 to about 20.

6. The method of claim 1 wherein the oxygen flow rate is between about 5 scorn to about 100 sccm.

7. The method of claim 1 wherein the inert gas is argon.

8. The method of claim 1 wherein flow rate of the inert gas is between about 20 sccm to about 400 sccm and the flow rate ratio of inert gas to oxygen gas is between about 1 to about 20.

9. The method of claim 1 wherein the process pressure is between about 2 mTorr to about 50 mTorr.

10. The method of claim 1 wherein the source power is between 200 watts to 1500 watts.

11. The method of claim 1 wherein the bias power is between 0 watts to 400 watts.

12. The method of claim 1 wherein the substrate has a patterned photoresist layer having patterns of dense regions and isolated regions.

13. The method of claim 12 wherein the pattern density of the dense region is greater than 20%.

14. The method of claim 12 wherein the pattern density of the isolated region is less than 10%.

15. The method of claim 12 wherein the etch rates of the dense regions and the isolated regions are controlled by the ratio of hydrocarbon gas to oxygen gas.

16. The method of claim 1, wherein the etch rate of the photoresist layer is less than 1 nm/second.

17. The method of claim 1, wherein the photoresist is a DUV resist.

* * * * *

UNITED STATES PATENT AND TRADEMARK OFFICE
CERTIFICATE OF CORRECTION

PATENT NO. : 6,911,399 B2
DATED : September 19, 2003
INVENTOR(S) : Wei Liu and David Mui It is certified that error appears in the above-identified patent and that said Letters Patent is hereby corrected as shown below:

Column 2,
Line 15, change "to leave" to -- gas mixture to etch --.
Line 39, change "integrate" to -- integrated --.

Column 8,
Line 7, change "claim 3" to -- claim 1 --.
Line 14, change "scorn" to -- sccm --.

Signed and Sealed this

Eleventh Day of April, 2006

JON W. DUDAS
*Director of the United States Patent and Trademark Office*

UNITED STATES PATENT AND TRADEMARK OFFICE
CERTIFICATE OF CORRECTION

PATENT NO. : 6,911,399 B2 Page 1 of 1
DATED : June 28, 2005
INVENTOR(S) : Wei Liu and David Mui It is certified that error appears in the above-identified patent and that said Letters Patent is hereby corrected as shown below:

Column 2,
Line 15, change "to leave" to -- gas mixture to etch --.
Line 39, change "integrate" to -- integrated --.

Column 8,
Line 7, change "claim 3" to -- claim 1 --.
Line 14, change "scorn" to -- sccm --.

This certificate supersedes Certificate of Correction issued April 11, 2006.

Signed and Sealed this

Second Day of May, 2006

JON W. DUDAS
*Director of the United States Patent and Trademark Office*